United States Patent [19]

Inoue et al.

[11] Patent Number: 5,192,082

[45] Date of Patent: Mar. 9, 1993

[54] TV GAME MACHINE

[75] Inventors: Yoshihiro Inoue, Kyoto; Kenichiro Ashida, Amagasaki, both of Japan

[73] Assignee: Nintendo Company Limited, Kyoto, Japan

[21] Appl. No.: 928,076

[22] Filed: Aug. 12, 1992

Related U.S. Application Data

[63] Continuation of Ser. No. 748,938, Aug. 23, 1991, abandoned.

[30] Foreign Application Priority Data

Aug. 24, 1990 [JP] Japan ............................... 2-89036[U]
Nov. 1, 1990 [JP] Japan ............................. 2-115097[U]

[51] Int. Cl.⁵ ............................................. A63F 9/22
[52] U.S. Cl. .................................................... 273/435
[58] Field of Search ..................... 273/434, 435, 148 B, 273/85 G; 361/337, 339, 343, 344, 345; 269/277

[56] References Cited

U.S. PATENT DOCUMENTS 3,851,505 12/1974 Wilkinson ............................. 70/255
4,095,791 6/1978 Smith et al. ....................... 273/85 G
4,323,979 4/1982 Johnston .
4,639,225 1/1987 Washizuka ................... 273/148 B X
4,818,986 4/1989 Bauman ........................... 361/339 X
4,865,321 9/1989 Nakagawa et al. ............... 273/85 G
4,926,286 5/1990 Maki et al. ........................... 361/345

FOREIGN PATENT DOCUMENTS

2736823 3/1978 Fed. Rep. of Germany .
2700836 C2 8/1984 Fed. Rep. of Germany .
2-49595 4/1990 Japan .
2033763 5/1980 United Kingdom .

*Primary Examiner*—William H. Grieb
*Attorney, Agent, or Firm*—Nixon & Vanderhye

[57] ABSTRACT

A locking groove extending in the horizontal direction is formed approximately at the center of a front surface of a cartridge. A power switch is turned on/off in response to an operation of a slide switch. When the power switch is turned on by the slide switch, a lock plate rotates in response to the operation of the slide switch. At this time, a projecting portion provided on one side of the lock plate is fit in the locking groove. Consequently, simultaneously with the turning on/off the power, the cartridge is locked so as not to be ejected.

10 Claims, 9 Drawing Sheets

TV GAME MACHINE

This is a continuation of application Ser. No. 07/748,938, filed Aug. 23, 1991, now abandoned.

BACKGROUND OF THE INVENTION

1. Field of the Invention

The present invention relates to a TV game machine and, more specifically, to a TV game machine to which a cartridge storing a game program can be freely attached and detached, and which executes a game program by reading the game program from the attached cartridge.

2. Description of the Background Art

A TV game machine executing prescribed game by reading a game program from an attached cartridge (for example TV game machines produced and sold by the assignee of the present application commercially available as the "family computer" and the "Nintendo Entertainment System") have been well known. In such a TV game machine, various games can be played by changing cartridges.

When a cartridge is ejected from the TV game machine in an undesired manner in the middle of the game, reading of the game program from the cartridge becomes impossible. This prevents game play, and it may cause the machine to malfunction. Therefore, a locking mechanism for preventing ejection of the attached cartridge has been proposed.

A TV game machine having a cartridge locking mechanism is disclosed in, for example, Japanese Utility Model Laying-Open No. 2-49595 (known under the commercial name of "MEGA DRIVE" owned by SEGA Enterprises).

The cartridge locking mechanism disclosed in this Japanese Utility Model Laying-Open No. 2-49595 is adapted to lock a cartridge by inserting a pawl portion of an arm member operating in relation to the operation of a power switch to a horizontal notch formed on one side portion of the cartridge.

However, in the above described locking mechanism of the cartridge, only one side portion of the cartridge is engaged. Therefore, when a cartridge is pulled diagonally upward, the cartridge is likely to be pulled out. The cartridge is pulled by one hand. If one tries to pull out the cartridge forcefully with the cartridge being locked, the force is concentrated at the pawl portion of the arm member, which is small. Therefore, the pawl portion or the arm member may be damaged. A TV game machine having an ejecting mechanism enabling vertical ejection of the cartridge utilizing the function of fulcrum, in order to prevent possible damage connecting portions if the cartridge were pulled out diagonally has been known. If the ejecting mechanism is provided in such a TV game machine, by the function of fulcrum, a larger force is applied to the pawl portion or the arm member compared with manual ejection Therefore, the pawl portion and the like tends to be damaged easily.

In addition, when the cartridge is inserted after turning on the power, the TV game machine is likely to be damaged. Therefore, a locking mechanism for preventing insertion of the cartridge after power has been turned on has been desired.

SUMMARY OF THE INVENTION

An object of the present invention is to provide a TV game machine reliably preventing undesired ejection of a cartridge when the power switch is turned on with the cartridge inserted, and reliably preventing insertion of a cartridge when the power switch is turned on.

Another object of the present invention is to provide a TV Game machine which is not easily damaged even if a great force is applied to a locked cartridge by an ejecting mechanism, for example, and which is not easily damaged even if a cartridge is pushed from above with a great force to be forcefully inserted when power is turned on.

A further object of the present invention is to provide a TV game machine which can reliably prevent undesired ejection of a cartridge when the power switch is on, assembly of which is easy and suitable for mass production.

A TV game machine in accordance with a first aspect of the present invention is formed such that a cartridge storing a game program can be freely attached to or detached from the TV game machine. The game machine executes programs for the game by reading a game program from the attached cartridge. The game machine comprises a housing having a cartridge inserting hole formed on an upper surface, and a power switch associated with the upper surface of the housing. The cartridge has a flat shape having one and the other major surfaces, and a locking groove extending in the horizontal direction is formed approximately at the center of one major surface. The power switch mechanism includes a slide switch, a power switch, and locking means The slide switch is slidably provided on the upper surface of the housing. The power switch is contained in the housing and it is turned on/off in response to the operation of the slide switch. The locking means is axially supported in the housing, rotated in response to the operation of the slide switch, and when it is rotated, a part thereof is fit in the locking groove of the cartridge.

A TV game machine in accordance with a second aspect of the present invention includes, in addition to the components of the TV game machine in accordance with the first aspect, an ejecting mechanism for forcefully ejecting the cartridge attached to the housing.

A TV game machine in accordance with a third aspect of the present invention includes, in addition to the components of the TV game machine in accordance with the first aspect, a door member provided to be opened/closed freely near the cartridge inserting hole for shutting the cartridge inserting hole when the cartridge is not attached, and a top panel attached to the upper surface of the housing. A plurality of holes for exposing to the outside the slide switch and the door member, and a plurality of engaging pawls at the outer periphery of the lower surface extending downward are provided on the top panel. A slide switch receiving portion for slidably receiving the slide switch, and a plurality of engaging concaves to which engaging pawls of the top panel are inserted are formed on the upper surface of the housing. The locking means rotates in response to the operation of the slide switch: when power is turned on, a portion thereof fits in the locking groove of the cartridge to prevent ejection of the cartridge: and when the power is turned on without the cartridge inserted, a portion thereof abuts the door member to prevent insertion of the cartridge.

In the TV game machine in accordance with the first aspect of the present invention, when a cartridge is attached to the housing and the power switch is turned on, the locking means rotates in response to the operation of the slide switch, and a part of the locking means is fit in the locking groove of the cartridge. Therefore, the cartridge is locked to prevent ejection. In the first aspect of the present invention, the locking groove to which the locking means fits is formed elongate along the horizontal direction approximately at the center of one major surface of the cartridge. Therefore, length of engagement between the locking means and the locking groove is sufficiently long to ensure stable state of locking. Since the central portion of one major surface of the cartridge is locked by the locking means, the locked state of the cartridge can be ensured more stably, no matter which direction the force for pulling the cartridge is applied, compared with the conventional blocking mechanism in which only one side portion of the cartridge is locked. For example, even if the cartridge is pulled up diagonally upward, the cartridge is stably retained by the locking means.

In the TV machine in accordance with the second aspect of the present invention, the cartridge can be held stably by the locking means, even if a great force is applied to the cartridge by the ejecting mechanism.

In the TV game machine in accordance with the third aspect of the present invention, a door member is attached to the cartridge inserting hole of the housing, the slide switch is attached to the slide switch receiving portion, a top panel is placed thereon, and engaging pawls of the top panel are inserted to respective engaging concaves of the upper surface of the housing, so that the slide switch and the door member are held by the housing. In this manner, in the third aspect of the present invention, troublesome steps of fixing by means of screws are unnecessary, and the step of assembly is very much simplified. Therefore, TV game machines suitable for mass production can be provided. Even if the user tries to insert the cartridge after power on, such insertion with the power being on is prevented, since a portion of the locking means abuts the door member and the door member does not open.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
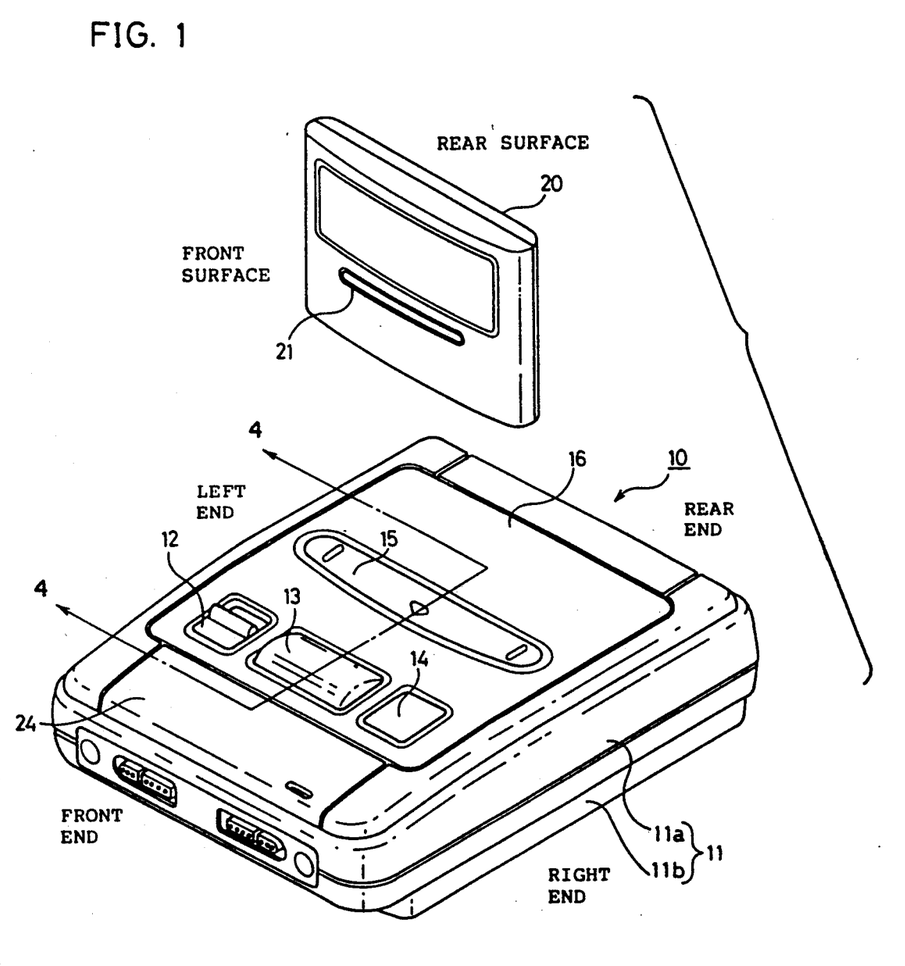
FIG. 1 is a perspective view of an appearance of the TV game machine in accordance with one embodiment of the present invention.

FIG. 1 is a perspective view of an appearance of the TV game machine in accordance with one embodiment of the present invention. The structure of this embodiment will be described with reference to FIG. 1. The TV game machine 10 include a flat rectangular housing 11 whose length in the lengthwise direction is little longer than the length of the lateral direction The housing 11 is divided into an upper housing 11a and a lower housing 11b. A power switch mechanism 12, an eject mechanism 13, a reset switch mechanism 14, a door member 15, a top panel 16 and a display panel 24 are provided associated with upper housing 11a.

A cartridge 20 which can be attached to and detached from the TV game machine 10 has a flat rectangular outer shape, for example Front surface of cartridge 20 has a smooth convex curve. An elongate locking groove 21 extending in the horizontal direction is formed approximately at the center of a front surface of cartridge 20. A cartridge board 22 (see FIGS. 3 and 4) is contained in cartridge 20. A memory (for example, ROM) storing program data and character data for the game are mounted on the cartridge board 22. The locking groove 21 cooperates with a lock plate 17 which will be described later (see FIGS. 2 and 3) so as to lock cartridge 20 to prevent ejection thereof when the power is on.

Figure 2:
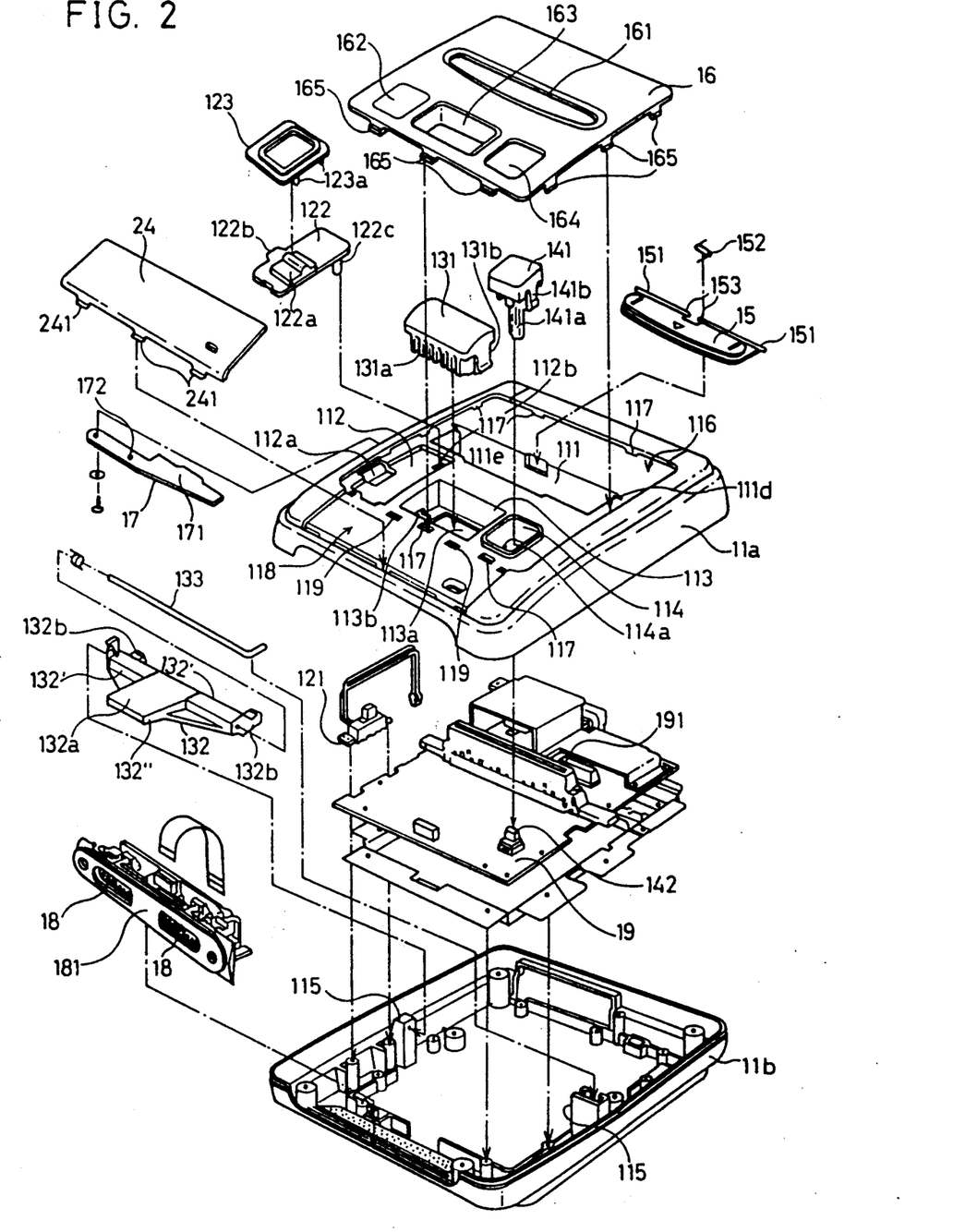
FIG. 2 is a fragmentary perspective view of the embodiment shown in FIG. 1.
Figure 3:
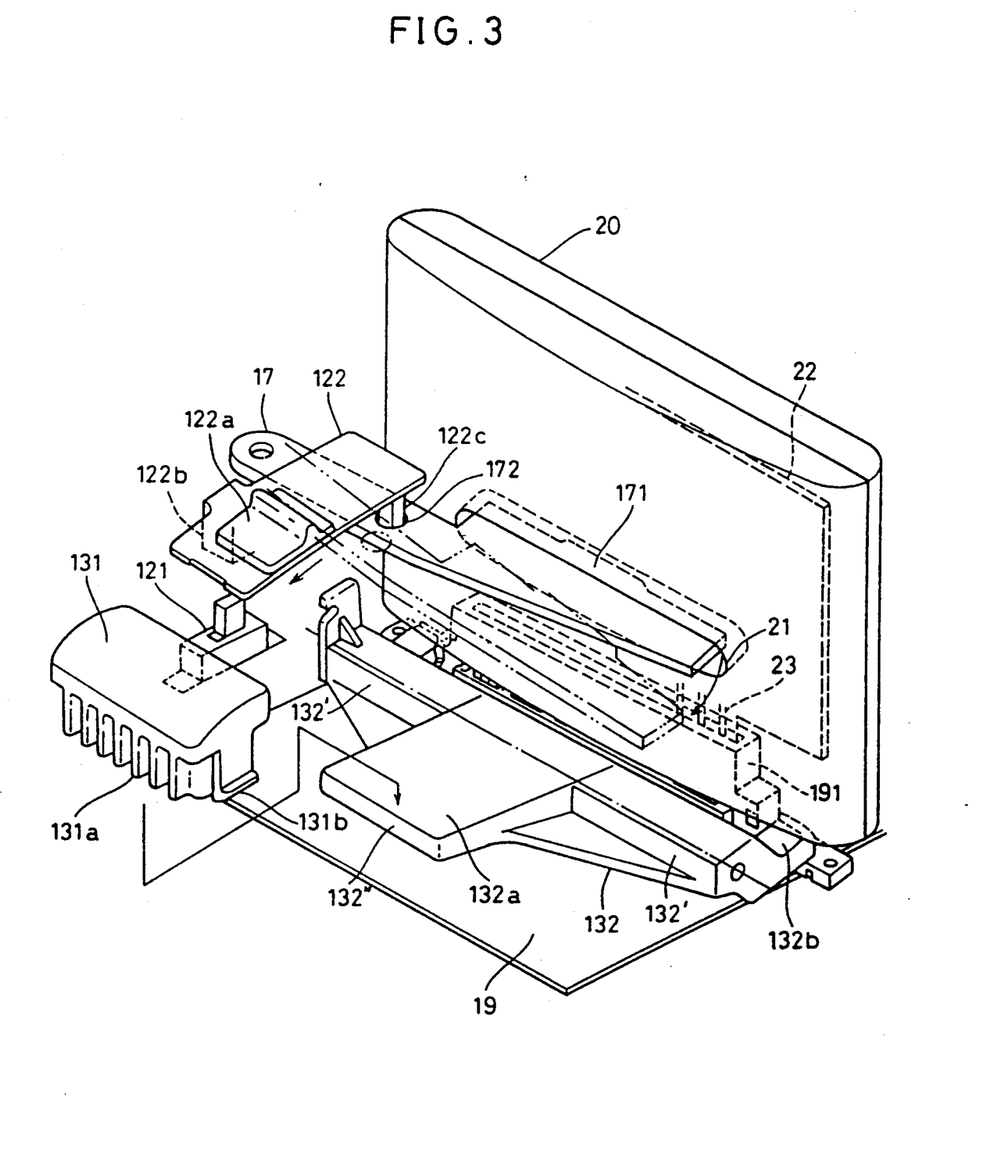
FIG. 3 is a fragmentary perspective view of the main portions of the embodiment shown in FIG. 1.
Figure 4:
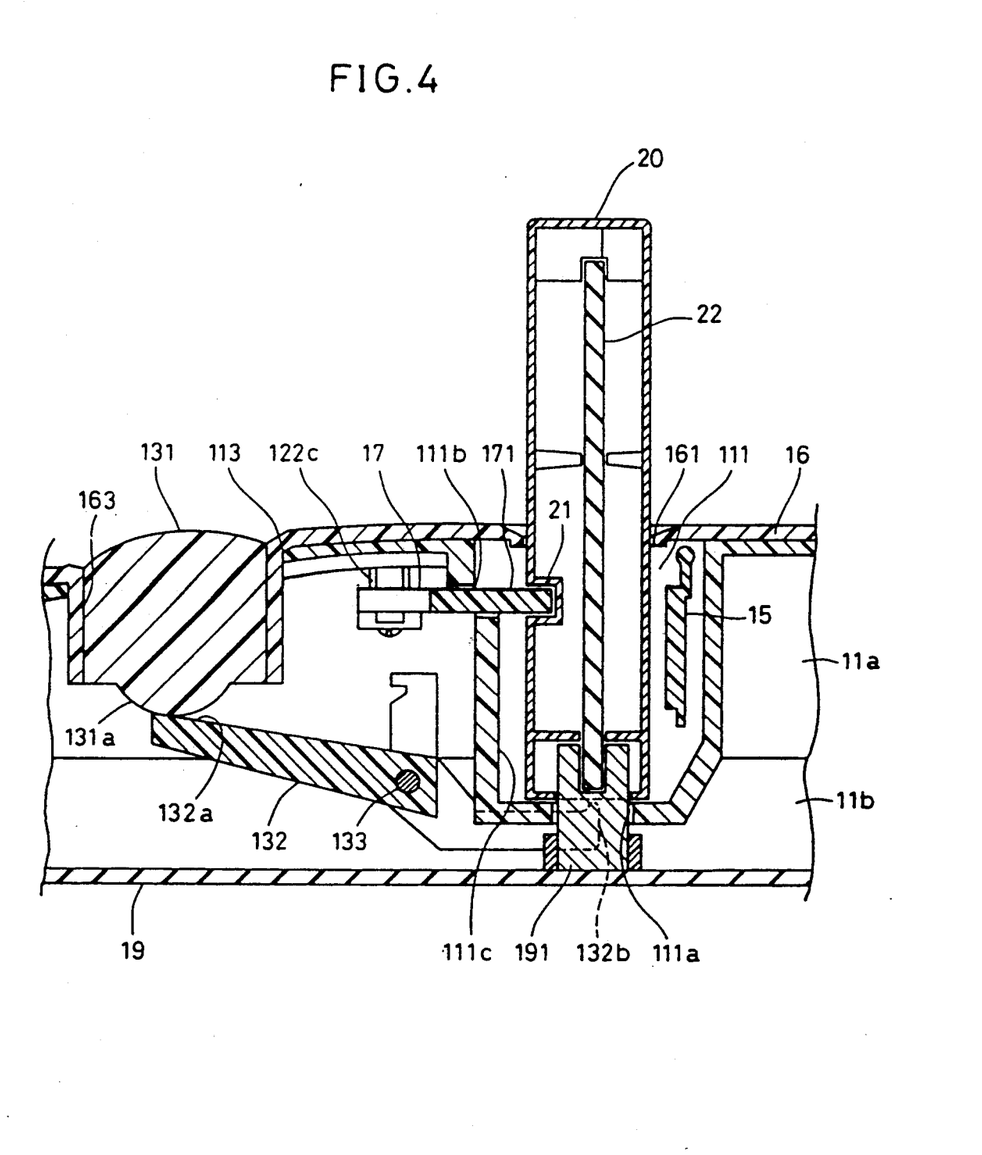
FIG. 4 is a partial cross section taken along the line X—X of the embodiment shown in FIG. 1.
Figure 5:
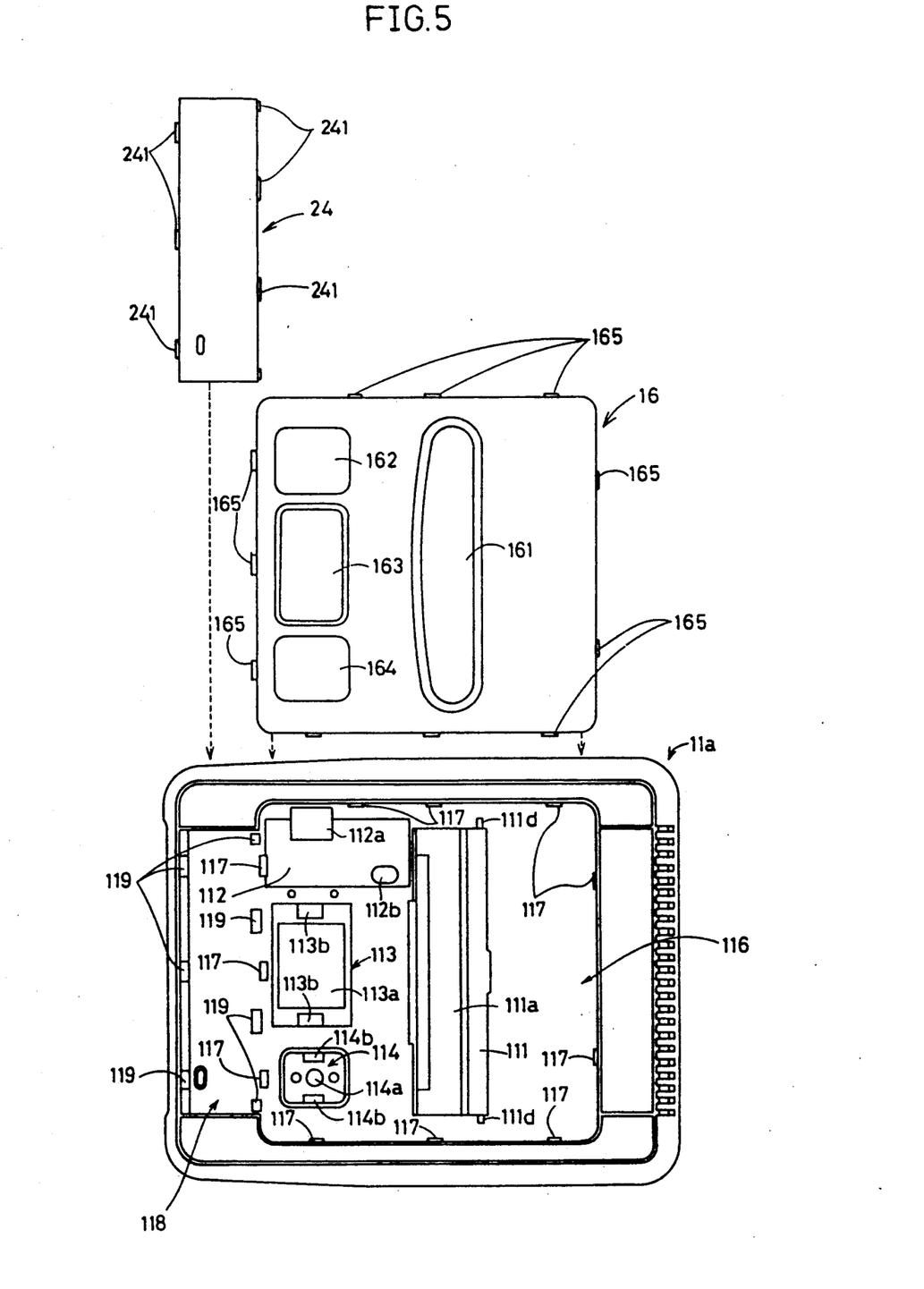
FIG. 5 shows the upper housing 11a, the top panel 16 and a display panel 24 of the embodiment of FIG. 1 in plan views, respectively.
Figure 6:
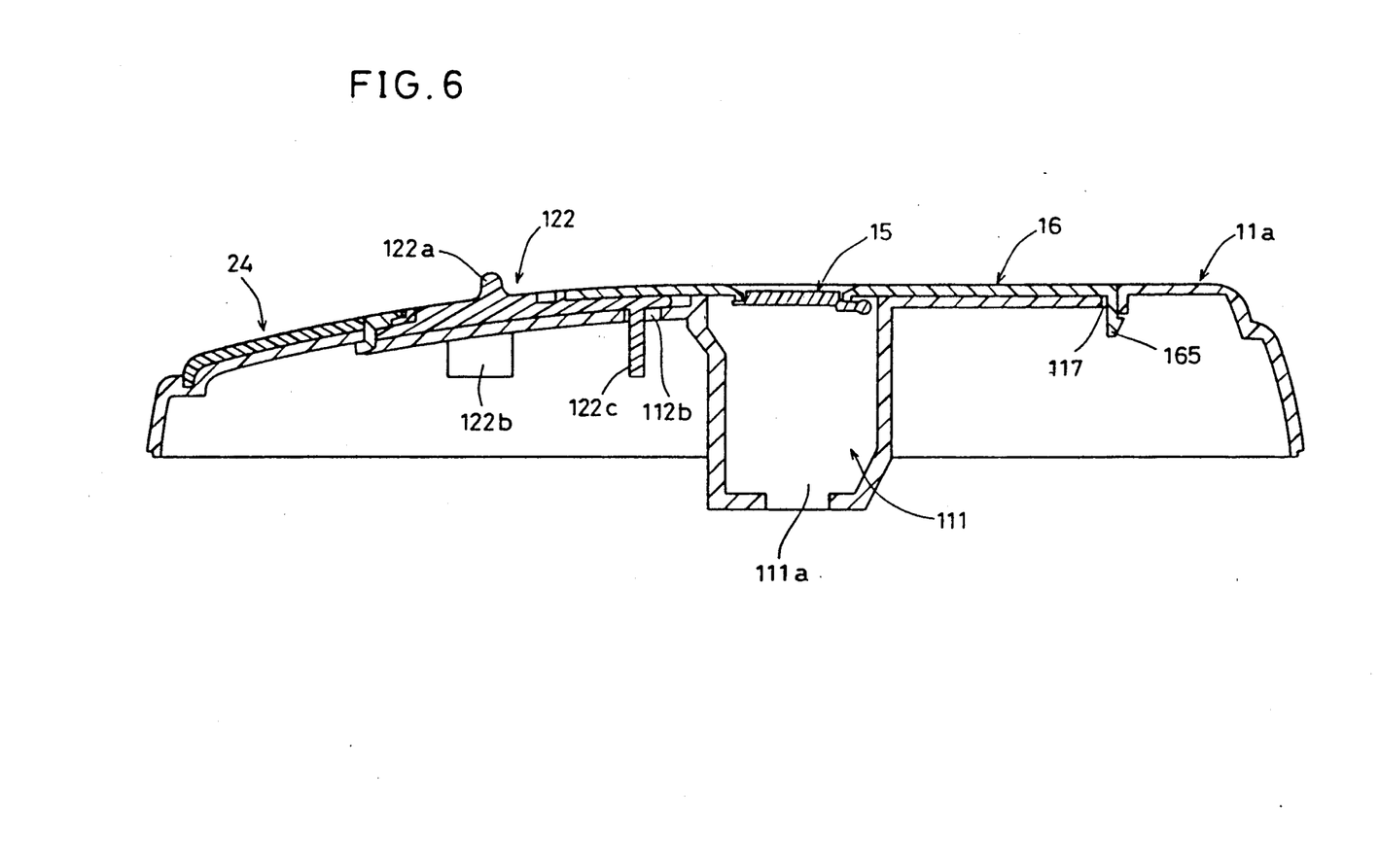
FIG. 6 is a vertical sectional view of the upper housing 11a of the embodiment shown in FIG. 1.

FIG. 2 is fragmentary perspective view of the embodiment shown in FIG. 1. FIG. 3 is a fragmentary perspective view of the a main portion of the embodiment shown in FIG. 1. FIG. 4 is a partial sectional view taken along the line X—X of the embodiment shown in FIG. 1. FIG. 5 shows the upper housing 11a, top panel 16 and display panel 24 of the embodiment shown in FIG. 1, in plan views, respectively FIG. 6 is a vertical sectional view of upper housing 11a of the embodiment shown in FIG. 1.

More detailed structure of the embodiment shown in FIG. 1 will be described with reference to FIGS. 2 to 6. A cartridge inserting hole 111 to which cartridge 20 is to be inserted is formed approximately at the center of the upper surface of upper housing 11a. Cartridge inserting hole 111 is an elongate hole extending in the left and right directions of housing 11 so as to receive cartridge 20. A step concave portion 116 having a depth approximately the same as the thickness of the top plate 16 is formed on the upper surface of upper housing 11a, in order that when top panel 16 is attached to upper housing 11a, upper surface of upper housing 11a has a smooth surface without any step. A plurality of engaging concave portions (or engaging holes) 117 are formed at the inner periphery of the step concave portion 116. Concave portions 112 to 114 for containing operating portions of power switch mechanism 12, eject mechanism 13 and reset switch mechanism 14, respectively, are formed on the upper surface of upper housing 11a in front of cartridge inserting hole 111.

Power switch mechanism 12 includes a power switch 121, a slide switch 122 and an attached member 123 (see FIG. 2). An operating portion 122a is formed on the upper surface of slide switch 122, and an engaging piece 122b which is engaged with power switch 121 is formed on the lower surface of slide switch 122. Attaching member 123 is formed as a frame having an opening, and operating portion 122a of slide switch 122 is exposed to the outside through the opening portion of the attaching member 123. It also retains the slide switch 122. An engaging project 123a is formed on the lower surface of the attaching member 123 for fixing the attaching member 123 at upper housing 11a. The lateral width of concave portion 122 of upper housing 11a is selected to be approximately the same as the lateral width of slide switch 122 so as to slidably receive the slide switch 122. The length in the front and rear direction, that is, in the lengthwise direction of the concave portion 112 is selected to be the sum of the length of the slide switch 122 and the sliding length, so as to limit the range of sliding of the slide switch. A through hole 112a is provided at a portion of the concave portion 112 corresponding to the engaging piece 122b of slide switch 122, and an elongate hole 112b is formed at a portion corresponding to a projection 122c, which will be described later.

A lock plate 17 is provided below slide switch 112. A hole 172 is formed at the lock plate 17 at a position spaced apart by a prescribed distance from one end thereof, serving as the center of rotation. A projection 122c engaging with the hole 172 is formed on the lower surface of slide switch 122. Therefore, lock plate 17 moves along with the sliding movement of slide switch 122. One end of lock plate 17 is axially supported by a support bar (not shown) formed on the upper housing 11a to be rotatable. A projecting portion 171 is formed at a portion of the side surface of lock plate 17 which portion faces cartridge inserting hole 111.

When cartridge 20 is inserted to cartridge inserting hole 111 and slide switch 122 is moved in the lengthwise direction to turn power switch 121 on, projection 122c inserted in hole 172 transmits sliding movement of slide switch 122 to lock plate 17. Consequently, lock plate 17 rotates about the supporting bar of upper housing 11a. Thus projecting portion 171 of lock plate 17 is fit in locking groove 21 of cartridge 20. In this manner, cartridge 20 is locked, and erroneous ejection of cartridge 20 while power switch 121 is on can be prevented.

Even if the user tries to insert the cartridge 20 after power on, the projecting portion 171 of the lock plate 17 abuts the door member 15 and the door member does not open. Therefore, insertion of the cartridge 20 with the power being on is prevented.

Eject mechanism 13 includes an eject button 131 and an eject lever 132. Eject button 131 has slip preventing hooks 131b extending downward formed at left and right ends. A curved depressing projection 131a for depressing eject lever 132 is formed on the lower portion of eject button 13. Eject lever 132 is formed to have a T-shape having a blade piece 132' thus extending in the left and right directions, and a tongue piece 132" extending orthogonally in front of the blade piece 132'. An axis 133 is inserted along the longitudinal direction of the blade piece 132 Both ends of the axis 133 project externally through left and right ends of blade piece 132' and axially supported to be rotatable, by a support portion 115 provided on lower housing 11b. An upper surface near the tip end portion of tongue piece 132" provides a portion 132a which is depressed by the depressing projection 131a of eject button 131. A pair of eject pawls 132b extending in opposite direction to tongue piece 132" orthogonal to axis 133 are formed on left and right ends of the blade piece 132'. Eject pawls 132b are arranged near left and right side surfaces of connector 191 (see FIGS. 2 and 3) on a lower portion of cartridge board 22. Each eject pawl 132b raises upward cartridge 20 by the function of fulcrum, when eject button 131 is depressed. Consequently, cartridge 20 is forcefully discharged.

Concave portion 113 formed on the upper housing 11a has such a shape as to receive eject button 131, and has a hole 113a for guiding depressing projection 131a to eject lever 132 (see FIG. 3). Holes 113b to which slip preventing hooks 113b are inserted are formed at left and right ends on the bottom surface of concave portion 113.

Reset switch mechanism 14 includes a reset button 141, and a reset switch 142. Reset button 141 includes a bar shaped guide 141a for depressing reset switch 142. The guide 141a projects downward from the central portion of the lower surface of reset button 141. A pair of slip preventing hooks 141b projecting downward are formed at left and right ends of the lower surface of reset button 141. Concave portion 114 formed at upper housing 11a has such a shape as to receive reset button 141. A hole 114a to which guide 141a is inserted, and holes 114b to which slip preventing hooks 141b are inserted are formed on the bottom surface of the concave portion 114 (see FIG. 5).

Door member 15 is little larger than the bottom surface of the cartridge 20 and little smaller than cartridge inserting hole 111. A pair of axes 151 are formed on one side along the longitudinal direction of the door member 15, and a holding portion 153 for holding a coil spring 152 is formed at the central portion of the said side. Cartridge inserting hole 11 formed at housing 11a is formed as a frame having sufficient size through which lower portion of cartridge 20 is inserted, and a hole 111a to which connecter 111 is inserted is formed at the bottom surface of the frame shaped portion (see FIGS. 4 and 5). A hole 111b to which projecting portion 171 of lock plate 17 is inserted and from which it is pulled out is formed on front wall 111c of the frame shaped portion of cartridge inserting hole 111 (see FIG. 4). Further, bearing portions 111d are formed at left and right ends of cartridge inserting hole 111, and a hole 111e for fixing a free end of coil spring 152 is formed at the center of an upper portion of rear wall of cartridge inserting hole 111.

A connecting terminal 23 for providing electrical contact with connector 191 is formed at an end of cartridge board 22 exposed from the case of cartridge 20 (see FIG. 3).

Top panel 16 is attached on the upper surface of upper housing 11a. Top panel 16 includes a plurality of engaging pawls 165 which are engaged with respective engaging concave portions 117 formed on upper housing 11a. The engaging pawls 165 are formed projecting downward at outer periphery of lower surface of the top panel 16 at positions corresponding to respective engaging concaves 117. On the upper surface of top panel 16, a hole 161 is formed at a position corresponding to cartridge inserting hole 111, a hole 162 is formed at a position corresponding to slide switch 122 of power switch mechanism 12, a hole 163 is formed at a position corresponding to eject mechanism 13 and a hole 164 is formed at a position corresponding to reset mechanism 14.

More preferably, a display panel 24 is attached to an inclined surface 111 of upper housing 11a in front of concave portions 112, 113 and 114. A plurality of engaging concave portions 119 are formed around the inclined surface 118. Engaging projections 241 projecting downward are formed at the peripheral portions of the lower surface of display panel 24.

A female connector 18 for connecting an operator (not shown) such as a controller or a joy stick is provided on a front side surface (front surface) of housing 11. Connector 18 is incorporated in front panel 181 and attached to housing 11 integrally so as to facilitate assembly. Two connectors 18 may be provided as needed, so that two players (players A and B) can play the game separately.

A circuit board 19 supported by a support bar is contained in housing 11. The electronics embodied within the TV game machine and game cartridge described herein is preferably that which is shown in applicants' assignees' copending U.S. application Ser. No. 07/651,265 (Takahishi et al), filed on Apr. 10, 1991. The entirety of application Ser. No. 07/651,265 is hereby expressly incorporated herein by reference. A central processing unit (CPU; see copending application Ser. No. 07/651,265) performing desired functions for the TV game and an image processing unit (PPU; see application Ser. No. 07/651,265) are attached to circuit board 19. Electronic parts such as connector 191 to which connecting terminal 23 of cartridge board 22 contained in cartridge 20 are attached on circuit board 19.

The method of assembling the TV game machine of the embodiment shown in FIGS. 1 to 6 will be described. At first, power switch 121 and circuit board 19 are fixed on lower housing 11b by means of screws, and front panel 181 is attached by fitting or the like. An axis 133 inserted to eject lever 132 is inserted to a support portion 115, so that eject level 132 is axially supported.

A lock plate 17 is axially supported on the lower surface of upper housing 11a. Thereafter, upper housing 11a is put on lower housing 11b and fixed by screws.

Thereafter, slide switch 122 is fit to concave portion 112 of upper housing 11a such that engaging piece 122b is engaged with power switch 121 and projecting portion 122c is inserted to hole 172 of lock plate 17. Then, attaching member 123 is fit on slide switch 122. At this time, engaging projection 123a of attaching member 123 is inserted to an engaging concave portion (not shown) formed on upper housing 11a. Eject button 131 is inserted to concave portion 113. The left and right slip preventing hooks 141b are pressed inward to be inserted to holes 114b, and thus reset button 141 is inserted to concave portion 114. Coil spring 152 is engaged in hole 111e from the upper surface of upper housing 11a, and axis 151 is received by bearing portions 111d. Thus door member 15 is attached on upper housing 11a to be freely opened/closed.

Thereafter, engaging projection 241 of display panel 24 is fit in concave portion 119, so that display panel 24 is attached on upper housing 11a. Then, top panel 16 is put on concave step portion 116 of upper housing 11a positioned such that operating portion 122a of slide switch 122 is exposed through hole 162, upper surface of eject button 131 is exposed through hole 163, and upper surface of reset button 141 exposed through hole 164. Plurality of engaging pawls 165 are successively (or approximately simultaneously) depressed on upper surface side of top panel 16, so that respective engaging pawls 165 are fit in corresponding engaging concave portions 117.

As described above, slide switch 122, eject button 131 and reset button 141 are attached to upper housing 11a without using screws. Consequently, the number of parts can be reduced, assembly can be done easily, and the number of necessary steps for assembly can be reduced. Therefore, the above-described embodiment is suitable for mass production and manufacturing cost can be decreased. In case of a repair, upper housing 11a is removed from lower housing 11b, and by pressing engaging pawls 165 inward from the lower surface of upper housing 11a, top panel 16 can be easily removed.

Operations of respective portions after the assembly of the above mentioned TV game machine 10 will be described. When a user uses TV game machine 10, he inserts a cartridge 20 storing program data of a desired game to cartridge inserting hole 111 of the TV game machine 10. Consequently, connecting terminal 23 formed on cartridge board 22 of cartridge 20 is electrically connected to connector 191 of TV game machine 10. Then, to start the game, the user moves slide switch 122 to turn power switch 121 on. In response to the sliding movement of slide switch 122, lock plate 17 rotates. Consequently, projecting portion 171 of lock plate 17 fits in locking groove 21 formed on cartridge 20. Thus cartridge 20 is locked so as not to be ejected. Therefore, even if eject button 131 is depressed undesirably while the power switch 121 is on, ejection of cartridge 20 is prevented and ejection is impossible. If the power is turned on without the cartridge inserted, the projecting portion 171 of the lock plate 17 abuts the door member 15. Therefore, the door member is locked to disable or prevent insertion of the cartridge. By forming the depressing projection 131a of eject button 131 to have a rounded shape as shown in FIG. 2 or 4, state of contact between depressing projection 131a and portion 132a to be depressed of eject lever 132 can be made smooth.

In order to more distinctively describe the characteristic of the above-described embodiment, operation when cartridge 20 is removed from TV game machine 10 will be described while comparing the present invention with the prior art.

In the locking mechanism of the cartridge disclosed in Japanese Utility Model Laying-Open No. 2-49595, when side surface of the cartridge on which notched portion is not formed is pulled up by a user, cartridge is rotated about the pawl portion of the arm member. Consequently, the cartridge may be pulled out, or the pawl portion may be damaged. Conversely, in the above described embodiment, lock plate 17 is inserted widely in horizontal direction approximately at the central portion of one major surface of cartridge 20. Therefore, even if the cartridge is pulled up diagonally, cartridge 20 cannot be removed from TV game machine 10 and the projecting portion 171 may not be damaged.

When the locking mechanism disclosed in Japanese Utility Model Laying-Open No. 2-49595 is applied to a TV game machine having an eject mechanism (for example, TV game machine commercially available under the name of "Family Computer" sold by the assignee of the present application), even if the eject mechanism is operated by a user with a small force, considerably great force is applied to the arm member and/or pawl portion. Therefore, force in the direction for bringing out the cartridge is concentrated to the pawl portion and the notched portion, causing damage to the pawl portion. The lock mechanism of the above described embodiment includes a longitudinal locking groove 21 extending in the horizontal direction on one major surface of cartridge 20 and a projecting portion 171 inserted approximately over the whole area of the locking groove 21. Therefore, compared with the conventional locking mechanism, the force in the direction of bringing out the cartridge 20 is received by larger area. In addition, since lock plate 17 is inserted to locking groove 21 through hole 111b formed on upper housing 11a (see FIG. 4), movement in the vertical direction of lock plate 17 is regulated by inner wall of hole 11b of upper housing 11a. Therefore, even if a great force is applied to cartridge 20 by eject mechanism 13, the force is dispersed to respective members, preventing damage to lock plate 17.

Figure 7:
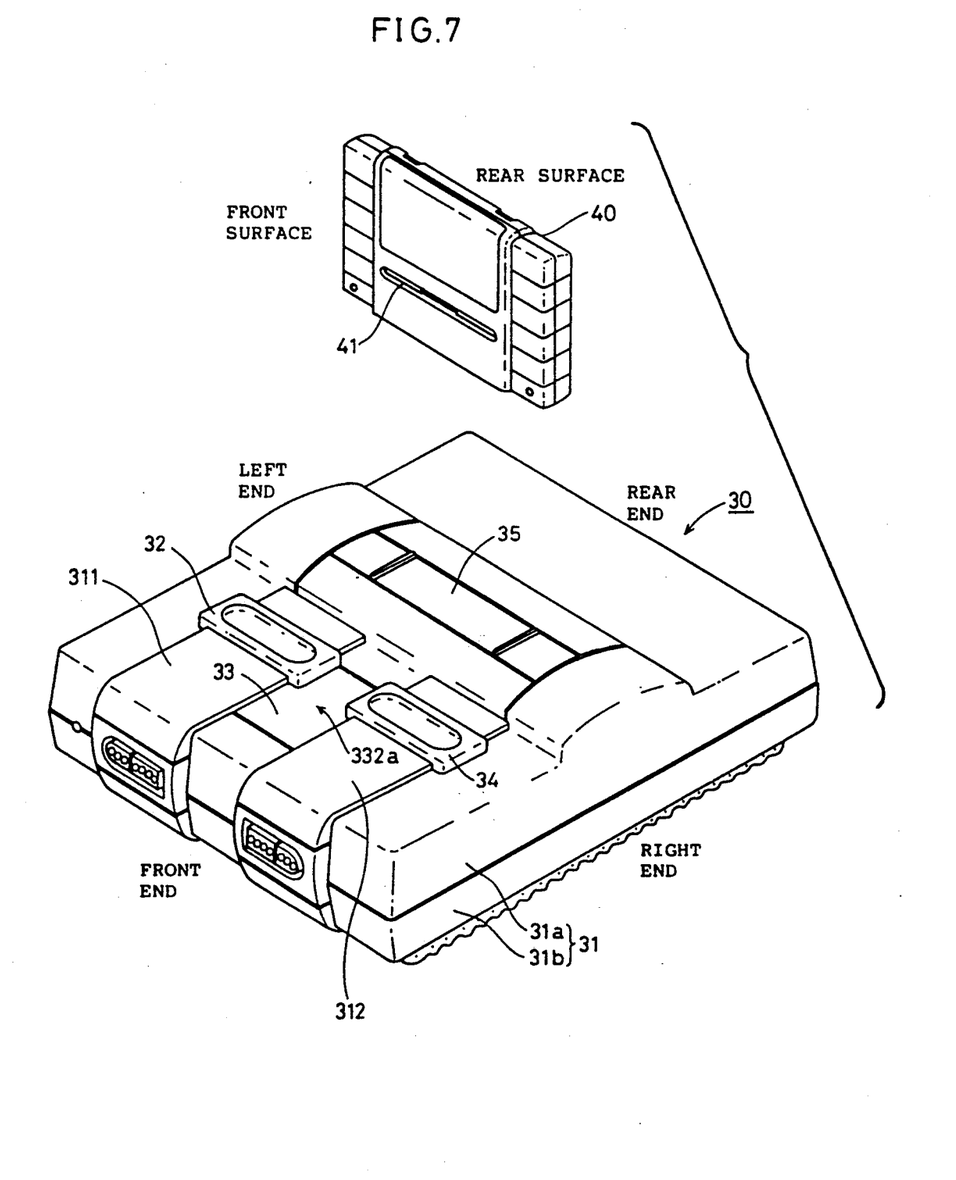
FIG. 7 is a perspective view of an appearance of the TV game machine in accordance with another embodiment of the present invention.
Figure 8:
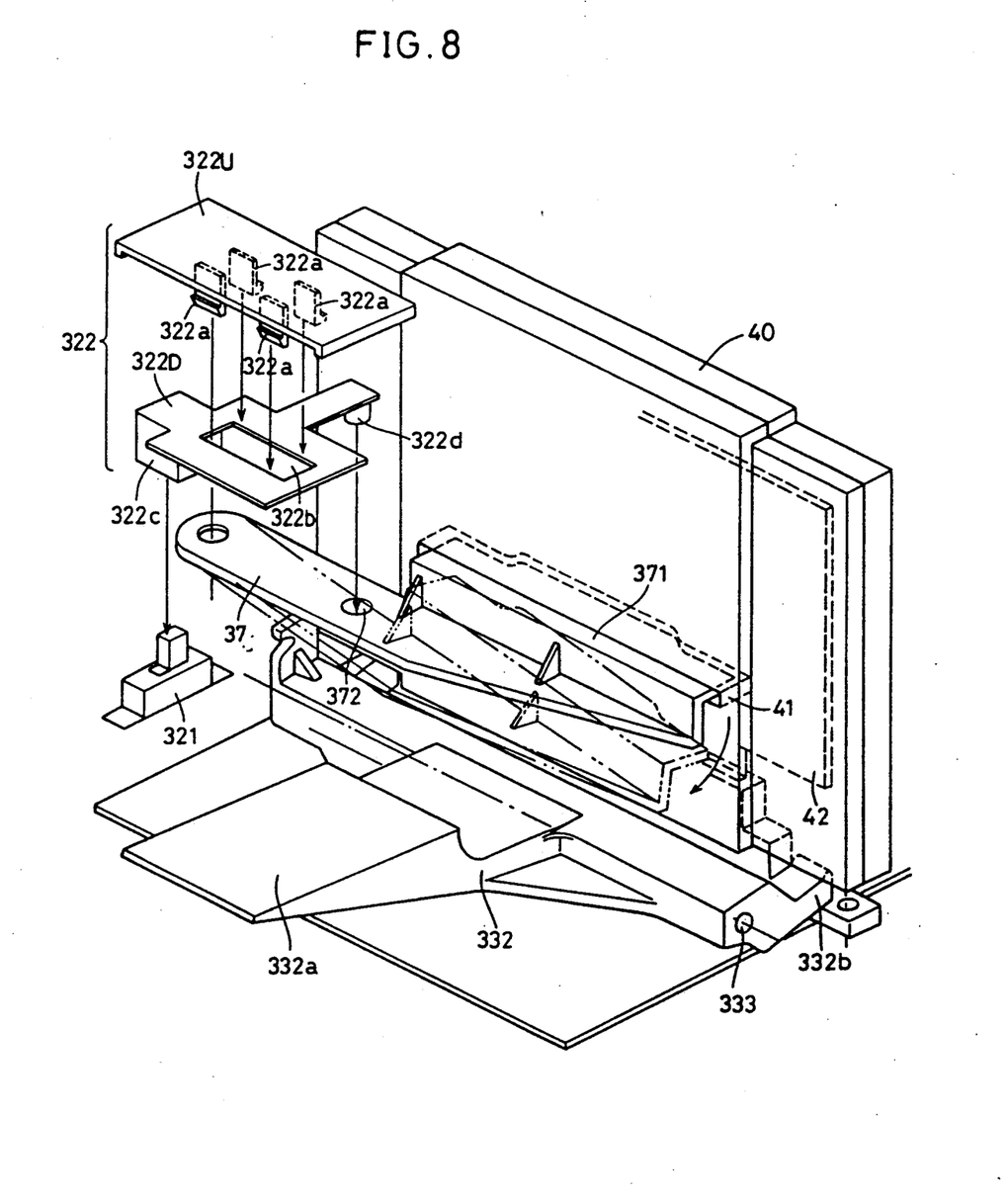
FIG. 8 is a fragmentary perspective view of the main portion of the embodiment shown in FIG. 7.
Figure 9:
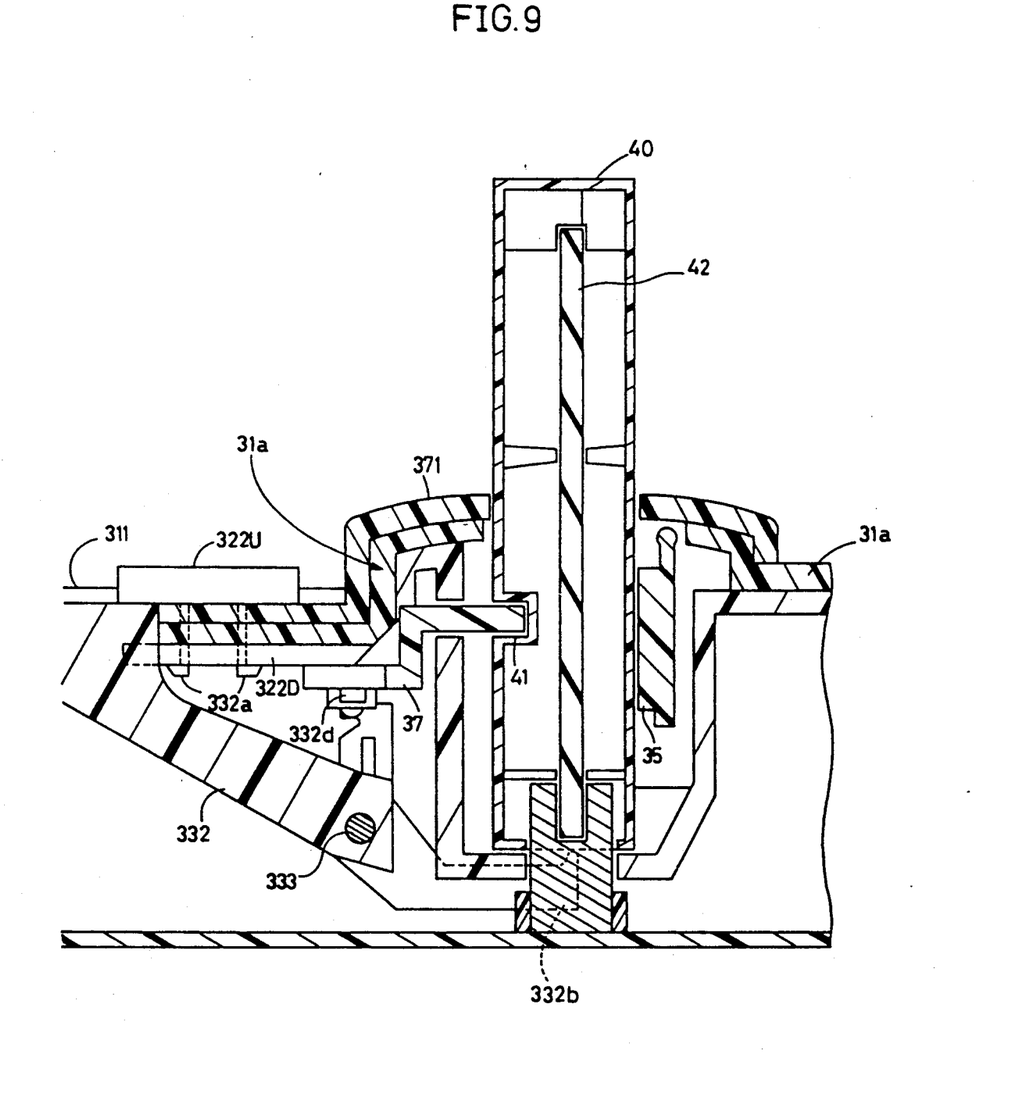
FIG. 9 is a cross section of a main portion of the embodiment shown in FIG. 7.

FIG. 7 is a perspective view of an appearance of a TV game machine in accordance with another embodiment of the present invention. FIG. 8 is a fragmentary perspective view of main portions of the embodiment shown in FIG. 7. FIG. 9 is a cross section of main portions of the embodiment shown in FIG. 7. The structure of the TV game machine in accordance with this embodiment of the present invention will be described with reference to FIGS. 7 to 9. The structure of the embodiment shown in FIGS. 7 and 8 is approximately the same as that of the embodiment shown in FIGS. 1 to 6. Therefore, only the characteristic portions of the embodiment shown in FIGS. 7 and 8 will be described. In a cartridge 40, a cartridge board 42 having a memory storing program data for the game is contained, as in the cartridge 20 of FIG. 1. A longitudinal locking groove 41 extending in the horizontal direction is formed approximately at the center on the front surface of cartridge 40.

A housing 31 of the TV game machine 30 is divided into an upper housing 31a and a lower housing 31b. The top panel 16 such as shown in FIG. 1 is not attached on the upper surface of upper housing 31a. With respect to upper housing 31a, a power switch mechanism 32, an eject mechanism 33, a reset switch mechanism 34 and a door member 35 are provided. The door member 35 is attached to be opened/closed freely on the upper surface of upper housing 31a. Lower portion of cartridge 40 is inserted to housing 31 through door member 35.

As shown in FIG. 8, power switch mechanism 32 includes a slide switch 322, a power switch 321 and a lock plate 37. Slide switch 322 is divided into an upper side switch member 322U and a lower slide switch member 322D. On the lower surface of upper slide switch member 322U, four engaging projections 322a projecting downward are formed. The engaging projection 322a are inserted to engaging holes 322b formed approximately at the center of lower slide switch member 322D. Consequently, lower slide switch member 322D is fixed to upper slide switch member 322U. A frame (not shown) for limiting the range of sliding of the lower slide switch member 322D is provided at a position corresponding to the lower switch member 322D at the rear surface of the upper housing 31a, whereby sliding of the slide switch 322 is guided. An engaging piece 322c and a projection 322d are formed on the lower surface of the lower slide switch member 322D. Engaging piece 322c engages with power switch 321, and it turns on/off power switch 321 along with the sliding operation of slide switch 322. The projection 322d is inserted to a hole 372 formed on lock plate 37. Thus the sliding movement of slide switch 322 is transmitted to lock plate 37, and lock plate 37 is rotated. A projecting portion 371 is formed on one side along the longitudinal direction of lock plate 37. Projecting portion 371 extends vertically upward from lock plate 37, and is bent in the midway at right angle, so that the tip end thereof extends in the horizontal direction. When lock plate 37 rotates along with the sliding operation of the slide switch 322, the tip end of the projecting portion 371 is fit to the locking groove 41. Thus the cartridge 40 is locked so as not to be ejected.

Even if the operator tries to insert the cartridge 40 after power on, projecting portion 371 of lock plate 37 abuts door member 35, and therefore insertion of cartridge 40 is prevented.

Eject mechanism 33 includes an eject lever 332. Upper surface of front end portion of eject lever 332 is formed approximately horizontal to provide a depressing portion 332a. Depressing portion 332a is directly exposed externally from the upper surface of upper housing 31a. Namely, in this embodiment, an eject button 131 such as shown in FIG. 2 is not provided, but the depressing portion 332a of eject lever 332 is directly depressed. When this portion 332a is depressed, eject lever 332 rotates about an axis 333 and by the eject pawl 332b provided at the rear end thereof, bottom portion of cartridge 40 is raised. As described in the foregoing, in the embodiment shown in FIGS. 7 to 9, projecting portions 371 of lock plate 37 is fit in a locking groove 41 provided horizontal at the central portion of one major surface of cartridge 40 to lock cartridge 40. Therefore, as in the embodiment shown in FIGS. 1 to 6, cartridge 40 can be locked stably. In addition, since the cartridge 40 is strongly locked, lock plate 37 is hardly damaged even if the eject lever 332 is operated with the cartridge 40 being locked.

Further, even if the user tries to insert cartridge 40 after power on, such insertion of cartridge 40 is prevented as in the embodiment shown in FIGS. 1 to 6, since door member 35 is locked by projecting portion 371 of lock plate 37.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A TV game machine to and from which a cartridge storing a game program can be attached and detached, for executing processes for a game by reading the game program from the attached cartridge, comprising:

a housing having a hole for inserting said cartridge at an upper surface; and a power switch mechanism provided related to the upper surface of said housing; wherein said cartridge has a flat shape with one and the other major surfaces, and a locking groove extending in horizontal direction formed approximately at the center of one major surface;

said power switch mechanism includes a slide switch slidably provided on the upper surface of said housing, a power switch contained in said housing and turned on/off in response to operation of said slide switch, and locking means axially supported in said housing and rotated in response to operation of said slide switch, a part of which is fit in the locking groove of said cartridge when it is rotated; whereby when said cartridge is attached to said housing and said power switch is turned on, said lock means is fit in the locking groove of said cartridge to lock said cartridge to prevent ejection of the cartridge.

2. A TV game machine according to claim 1, wherein said slide switch includes a bar shaped projection extending downward in said housing, said locking means having an engaging hole to which the bar shaped projection of said slide switch is inserted, whereby sliding movement of the slide switch is transmitted as a rotation movement to said locking means.

3. A TV game machine according to claim 2, wherein said locking means has one end axially supported in said housing, and an engaging hole, to which said bar shaped projection is inserted, is formed at a region between said one end and a portion which is to be fit in said locking groove.

4. A TV game machine according to claim 2, wherein said slide switch includes an upper switch member and a lower switch member, said upper switch member having an operating portion exposed externally from the upper surface of said housing, said lower switch member having said bar shape projection formed on the lower surface, and said upper switch member and said lower switch member being integrated and fitted to each other.

5. The TV game apparatus according to claim 4, further comprising:

a door member; wherein said locking means abuts said door member to prevent opening of said door member when said cartridge is not inserted and power is turned on, to prevent insertion of said cartridge when power is on.

6. A TV game machine according to claim 1, wherein a hole is formed, to and from which said locking means is inserted and removed, movement in vertical direction of said locking means regulated by a wall defining said hole.

7. A TV game machine to and from which a cartridge storing a game program can be attached and detached, for executing processes for the game by reading the game program from the attached cartridge, comprising:

a housing having a hole for inserting said cartridge is formed on an upper surface;

an eject mechanism for forcefully discharging said cartridge attached to said housing; and power switch mechanism provided related to the upper surface of said housing; wherein said cartridge has a flat shape with one and the other major surfaces and a locking groove extending in horizontal direction formed approximately at the center of one major surface, said power switch mechanism includes a slide switch slidably provided on the upper surface of said housing, a power switch contained in said housing and turned on/off in response to operation of said slide switch, and locking means axially supported in said housing and rotated in response to operation of said slide switch, a part of which is fit in the locking groove of said cartridge when it is rotated; whereby when said cartridge is attached to said housing and said power switch is turned on, said locking means is fit in the locking groove of said cartridge to lock said cartridge, preventing discharge of the cartridge by said eject mechanism.

8. A TV game machine according to claim 7, wherein said eject mechanism includes an eject button operation surface of which is provided to be exposed from the surface of said housing, and an eject lever rotatably supported in said housing, having a portion to be depressed by said eject button formed at one end, and an eject pawl formed on the other end, said eject lever being rotated when the portion to be depressed is depressed by said eject button for raising bottom surface of said cartridge by means of said eject pawl.

9. A TV game machine according to claim 7, wherein said eject mechanism includes an eject lever supported rotatably in said housing having an operating portion exposed at the upper surface of said housing formed on one end and an eject pawl formed on the other end, said eject lever being rotated when said operating portion is depressed for raising upward the bottom surface of said cartridge by said eject pawl.

10. A TV game machine to and from which a cartridge storing a game program can be attached and detached, for executing processes for the game by reading the game program from the attached cartridge, comprising:

a housing having a hole to which the cartridge is inserted formed on the upper surface;

a power switch mechanism provided related to the upper surface of said housing;

a door member provided near the hole for inserting said cartridge to be freely opened and closed, for shutting the hole for inserting the cartridge when the cartridge is not attached; and a top panel attached to the upper surface of said housing; wherein said cartridge having a flat shape with one and the other major surfaces and a locking groove extending in the horizontal direction formed approximately at the center of one major surface;

said power switch mechanism includes a slide switch slidably provided on the upper surface of said upper housing, a power switch contained in said housing and turned on/off in response to operation of said slide switch, and locking means axially supported in said housing and rotated in response to operation of said slide switch, a part of which is fit to the locking groove of said cartridge when it is rotated at power on for locking said cartridge to prevent ejection of the cartridge and a part of which abuts said door member when power is turned on without inserting said cartridge so as to prevent and lock insertion of said cartridge;

said top panel having a plurality of holes for externally exposing said slide switch and said door member, and a plurality of engaging pawls extending downward at an outer periphery of the lower surface thereof;

a slide switch receiving portion for slidably receiving said slide switch, and a plurality of engaging concave portions to which the engaging pawls of said top panel are inserted are formed on the upper surface of said housing, and by attaching said door member in the cartridge inserting hole of said housing, attaching said slide switch to said slide switch receiving portion and placing said top panel thereon, and by inserting respective engaging pawls of the top panel to respective engaging concave portions on the upper surface of said housing, the slide switch and the door member are held in said housing.

* * * * *

UNITED STATES PATENT AND TRADEMARK OFFICE
CERTIFICATE OF CORRECTION

PATENT NO. : 5,192,082
DATED : Mar. 9, 1993
INVENTOR(S) : Inoue, et al.

It is certified that error appears in the above-indentified patent and that said Letters Patent is hereby corrected as shown below:

Column 1, line 17, after "game" (second occurrence) insert --programs--;

line 24, after "ing" insert --game--.

Signed and Sealed this

Twenty-first Day of June, 1994

*Attest:*

BRUCE LEHMAN

*Attesting Officer*     *Commissioner of Patents and Trademarks*